(12) United States Patent
Merrill et al.

(10) Patent No.: US 7,834,411 B2
(45) Date of Patent: Nov. 16, 2010

(54) CMOS PIXEL SENSOR WITH DEPLETED PHOTOCOLLECTORS AND A DEPLETED COMMON NODE

(75) Inventors: Richard B. Merrill, Woodside, CA (US); Shri Ramaswami, Gilbert, AZ (US); Glenn J. Keller, West Chester, PA (US)

(73) Assignee: Foveon, Inc., Santa Clara, CA (US)

( * ) Notice: Subject to any disclaimer, the term of this patent is extended or adjusted under 35 U.S.C. 154(b) by 795 days.

(21) Appl. No.: 11/748,928

(22) Filed: May 15, 2007

(65) Prior Publication Data

US 2008/0283880 A1 Nov. 20, 2008

(51) Int. Cl.
*H01L 31/00* (2006.01)
(52) U.S. Cl. .................. 257/440; 257/290; 257/292; 257/293; 257/294; 257/E31.084; 257/E31.12; 257/E31.121
(58) Field of Classification Search .......... 257/290, 257/292, 293, 294, 440, E31.084, E31.12, 257/E31.121
See application file for complete search history.

(56) References Cited

U.S. PATENT DOCUMENTS

| | | | | | |
|---|---|---|---|---|---|
| 5,625,210 | A | * | 4/1997 | Lee et al. | 257/292 |
| 5,903,021 | A | * | 5/1999 | Lee et al. | 257/292 |
| 5,904,493 | A | * | 5/1999 | Lee et al. | 438/57 |
| 6,093,670 | A | * | 7/2000 | Brown | 502/50 |
| 6,380,568 | B1 | * | 4/2002 | Lee et al. | 257/251 |
| 6,388,243 | B1 | * | 5/2002 | Berezin et al. | 250/208.1 |
| 6,727,521 | B2 | * | 4/2004 | Merrill | 257/98 |
| 6,841,816 | B2 | * | 1/2005 | Merrill et al. | 257/294 |
| 6,960,757 | B2 | * | 11/2005 | Merrill et al. | 250/226 |
| 7,115,855 | B2 | * | 10/2006 | Hong | 250/214.1 |
| 7,119,322 | B2 | * | 10/2006 | Hong | 250/214.1 |
| 7,132,724 | B1 | * | 11/2006 | Merrill | 257/440 |
| 2005/0051701 | A1 | * | 3/2005 | Hong | 250/214.1 |

OTHER PUBLICATIONS

Notification of Transmittal of the International Search Report and Written Opinion dated Aug. 4, 2008 of corresponding International Patent Application No. PCT/US08/63222, 8 pages.

* cited by examiner

*Primary Examiner*—Bradley K Smith
*Assistant Examiner*—Alexander Belousov
(74) *Attorney, Agent, or Firm*—Lewis and Roca LLP

(57) ABSTRACT

An active pixel sensor in a p-type semiconductor body includes an n-type common node formed below a pinning region. A plurality of n-type blue detectors more lightly doped than the common node are disposed below pinning regions and are spaced apart from the common node forming channels below blue color-select gates. A buried green photocollector is coupled to the surface through a first deep contact spaced apart from the common node forming a channel below a green color-select gate. A red photocollector buried deeper than the green photocollector is coupled to the surface through a second deep contact spaced apart from the common node forming a channel below a red color-select gate. A reset-transistor has a source disposed over and in contact with the common node. A source-follower transistor has gate coupled to the common node, a drain coupled to a power-supply node, and a source forming a pixel-sensor output.

10 Claims, 6 Drawing Sheets

Exhibit A

US 7,834,411 B2

CMOS PIXEL SENSOR WITH DEPLETED PHOTOCOLLECTORS AND A DEPLETED COMMON NODE

BACKGROUND OF THE INVENTION

1. Field of the Invention

The present invention relates to CMOS active pixel sensors. More particularly, the present invention relates to such pixel sensors having depleted photocollectors coupled to a depleted common node.

2. The Prior Art

Active pixel sensors that use a pinned photodiode are well known in the art. See, for example, U.S. Pat. No. 5,904,493. The pinned photodiode is advantageous as it prevents the high leakage current due to surface defects in the semiconductor materials used to make the photodiode. An additional improvement to the pinned photodiode is the fully depleted pinned photodiode as shown, for example, in U.S. Pat. No. 6,388,243. The depleted photodiode allows for reduction in photodiode capacitance which improves light sensitivity and cancellation of reset noise which improves signal-to-noise ratio, in addition to the lower leakage of the pinned diode. Most active pixel sensors that employ a pinned photodiode also have a sensing node coupled to the diode, usually through a transistor. The sensing node can also be pinned to improve performance by reducing capacitance and leakage effects as shown in U.S. Pat. No. 7,119,322. Another trend in active pixel sensor design is the reduction of pixel size and the desire to reduce the amount of circuitry within each pixel. Reducing the pixel size reduces the photocollection area, thereby reducing sensitivity. In order to counteract this sensitivity reduction, it is desirable to share readout circuits among more than one pixel as shown in U.S. Pat. No. 6,093,670. However, sharing the circuits can introduce problems such as increased capacitance and noise.

A new class of image sensors uses multiple detectors stacked in a vertical arrangement to make a multi-color sensor as exemplified in U.S. Pat. No. 6,727,521. The multi-color sensor that employs vertically stacked pixel sensors also benefits from sharing of wires and circuitry, particularly because the stacked pixel design has more photocollection sites per unit area of the sensor as shown in U.S. Pat. No. 6,960,757. Sharing the sense node of a single readout circuit among a number of photocollection circuits in a vertical stacked pixel sensor can also lead to degradation of performance similar to the conventional sensor, and therefore a way to counteract the negative effects of sharing readout circuits is needed. The invention embodied herein provides a method for improving the performance of an active pixel sensor that uses a shared readout node.

BRIEF DESCRIPTION OF THE INVENTION

A multi-color active pixel sensor is formed in a p-type semiconductor body. A depleted common node formed from an n-type region is disposed in the semiconductor body below a p-type common-node pinning region disposed on the surface of the semiconductor body, a first edge of the n-type region extending beyond an edge of the p-type common-node pinning region. A plurality of depleted blue photocollectors is disposed in the semiconductor body. Each blue photocollector includes a detector n-type region more lightly doped than the depleted common node n-type region disposed in the semiconductor body below a p-type blue-detector pinning region disposed on the surface of the semiconductor body. An edge of each detector n-type region extends beyond an edge of the p-type blue-detector pinning region and is spaced apart from the common node n-type region to form a blue-select channel. A polysilicon blue color-select gate overlies and is insulated from each blue-select channel. Each blue color-select gate is coupled to a different blue color select signal line.

A green photocollector is disposed in the semiconductor body at a depth greater than that of the blue photocollectors and is electrically coupled to the surface of the semiconductor body through a first deep contact spaced apart from the common node to form a green-select channel. A polysilicon green color-select gate overlies and is insulated from the green-select channel. The green color-select gate is coupled to a green color-select signal line.

A red photocollector is disposed in the semiconductor body at a depth greater than that of the green photocollector and is electrically coupled to the surface of the semiconductor body through a second deep contact spaced apart from the common node to form a red-select channel. A polysilicon red color-select gate overlies and is insulated from the red-select channel. The red color-select gate is coupled to a red color-select signal line.

An n-type reset-transistor source region is disposed in the semiconductor body, a second edge of the n-type common-node region underlies and is in electrical contact with the n-type reset-transistor source region. An n-type reset-transistor drain region is disposed in the semiconductor body, is spaced apart from the reset-transistor source region to form a reset transistor channel, and is coupled to a power-supply node. A polysilicon reset-transistor gate overlies and is insulated from the reset-transistor channel. The reset-transistor gate is coupled to a reset-signal line.

A source-follower transistor has a gate coupled to the common node, a drain coupled to a power-supply node, and a source forming a pixel-sensor output.

BRIEF DESCRIPTION OF THE DRAWING FIGURES

DETAILED DESCRIPTION OF THE INVENTION

Persons of ordinary skill in the art will realize that the following description of the present invention is illustrative only and not in any way limiting. Other embodiments of the invention will readily suggest themselves to such skilled persons.

Figure 1:
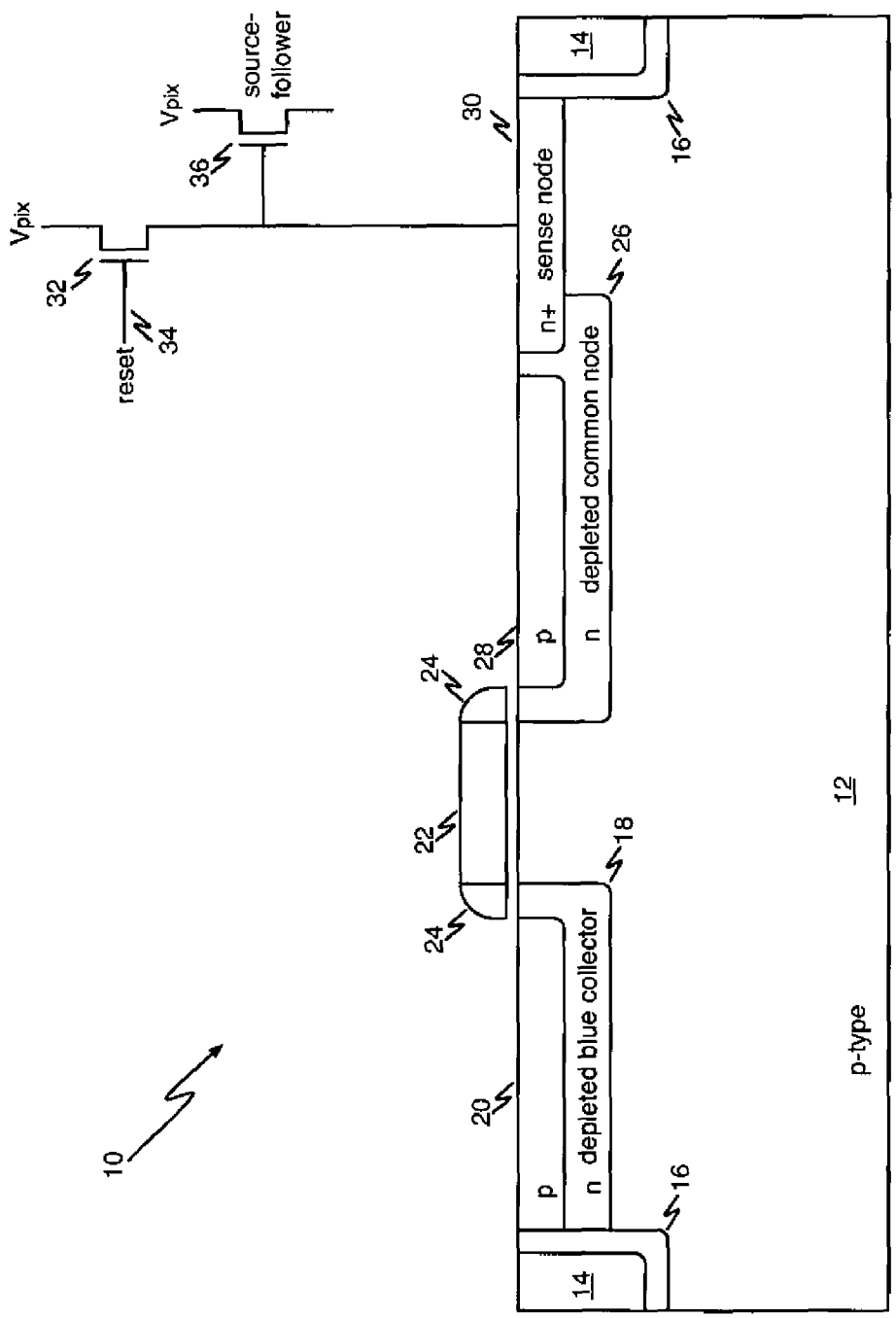
FIG. 1 is a cross-sectional view of a portion of a CMOS active pixel sensor according to the principles of the present invention.

Referring first to FIG. 1, a cross-sectional view of a portion 10 of an illustrative active CMOS pixel sensor according to the present invention. FIG. 1 shows only a single photocollector for simplicity, though the preferred embodiment employs a plurality of photocollectors. The active pixel sensor is formed in a p-type semiconductor body, which may be a well in a semiconductor substrate or may be the substrate itself. The pixel sensor is formed between field oxide regions 14 at the edges of which field-stop implants 16 have been made as is known in the art.

An n-type depleted blue collector 18 is formed in the p-type region 12 and is covered by a p-type pinning region 20. N-type blue collector 18 is shown bounded at the left edge by field oxide region 14 and field-stop implant 16. A polysilicon gate 22 is aligned with the edge of n-type blue collector 18 and spacers 24 are used to place the edge of p-type pinning region 20 back from the edge of n-type blue collector 18.

A n-type depleted common node 26 has one edge aligned with the edge of polysilicon gate 22. A p-type pinning region 28 overlies n-type depleted common node 26 and is aligned with the spacer 24 shown at the right edge of polysilicon gate 22.

An n-type sense node 30 is formed in semiconductor body 12. The right edge of depleted common node 26 extends under and makes electrical contact with n-type sense node 30.

N-type sense node 30 is coupled to the source of an n-channel reset transistor for the pixel sensor, shown as a schematic symbol at reference numeral 32. As will be appreciated by persons of ordinary skill in the art, sense node 30 may also serve as the source of reset transistor 32. The gate of n-channel reset transistor 32 is coupled to a reset line 34.

N-type sense node 30 is coupled to the gate of an n-channel source-follower amplifier transistor 36 for the pixel sensor 10. The drain of n-channel source-follower amplifier transistor 36 is coupled to a power-supply node, shown as $V_{pix}$ in FIG. 1.

Figure 2A:
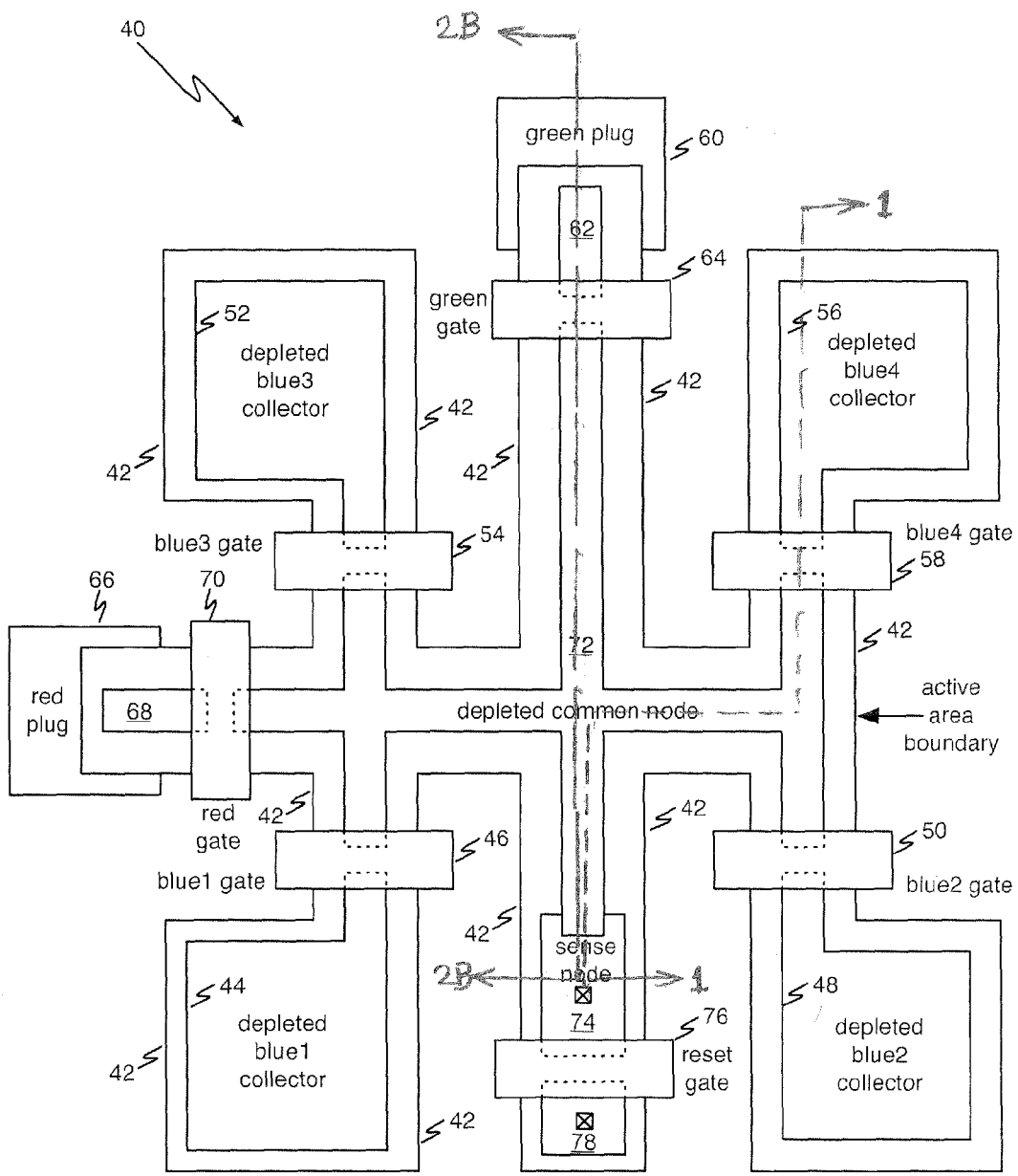
FIG. 2A is a top view of an exemplary layout of a multi-color CMOS active pixel sensor according to the principles of the present invention.

Referring now to FIG. 2A, top view shows an exemplary layout of a multicolor active CMOS pixel sensor 40 according to the principles of the present invention. Pixel sensor 40 includes four depleted blue photocollectors, one green photocollector, and one red photocollector. Although not shown in FIG. 2A, it is possible to have the same number of red and green collectors as blue collectors, or to have a larger number of either red or green photocollectors and still obtain the benefits of the invention.

Pixel sensor 40 includes an active area having an outside perimeter designated by reference numeral 42. An n-type blue1 photocollector has an outside perimeter designated by reference numeral 44 that extends under blue1 select gate 46. Similarly, an n-type blue2 photocollector has an outside perimeter designated by reference numeral 48 that extends under blue2 select gate 50; an n-type blue3 photocollector has an outside perimeter designated by reference numeral 52 that extends under blue3 select gate 54; an n-type blue4 photocollector has an outside perimeter designated by reference numeral 56 that extends under blue4 select gate 58.

A green deep contact plug 60 makes a connection to a buried green photocollector disposed below the surface of the semiconductor body at a depth that optimizes collection of green photons as is known in the art. Deep contact plug 60 makes contact with n-type region 62 that extends under green select gate 64. Similarly, a red deep contact plug 66 makes a connection to a buried red photocollector disposed below the surface of the semiconductor body at a depth that optimizes collection of red photons as is known in the art. Deep contact plug 66 makes contact with n-type region 68 that extends under the edge of red select gate 70. N-type regions 62 and 68 may be disposed below pinning p-type regions (not shown in FIG. 2A) as shown for the exemplary blue collector 18 in FIG. 1.

A depleted common node 72 is formed within active area 42. Depleted common node 72 extends under blue1 select gate 46, blue2 select gate 50, blue3 select gate 54, blue2 select gate 58, green select gate 64, and red select gate 70. The edges of depleted common node 72 are spaced apart from the edges of blue1 photocollector 44 blue2 photocollector 48, blue3 photocollector 52, photocollector 56, green n-type region 62, and red n-type region 68 so as to form transistor channels one example of which is illustrated in FIG. 1 between n-type blue collector 18 and n-type depleted common node 26.

In FIG. 2A depleted common node 72 is also in contact with n-type sense node 74 in the manner shown in the cross-sectional diagram of FIG. 1, wherein the depleted common node and the n-type sense node correspond to 26 and 30, respectively. An edge of n-type sense node 74 extends under reset gate 76. A contact, shown formed in n-type sense node 74 above reference numeral 74, is used to make a connection to the gate of a source-follower amplifier transistor (amplifier transistor is not shown in FIG. 2A). The relationship between sense node 74 and the source follower amplifier transistor is illustrated in FIG. 1 as transistor 36 and sense node 30.

An n-type region 78 has an edge that also extends under reset gate 76 and is spaced apart from the edge of n-type sense node 74 that extends under reset gate 76 to form a channel for the reset transistor as is known in the art. A contact, shown formed in n-type region 78 above reference numeral 78, is used to make a connection to the $V_{pix}$ supply potential, shown in FIG. 1 as the drain of transistor 32.

Figure 2B:
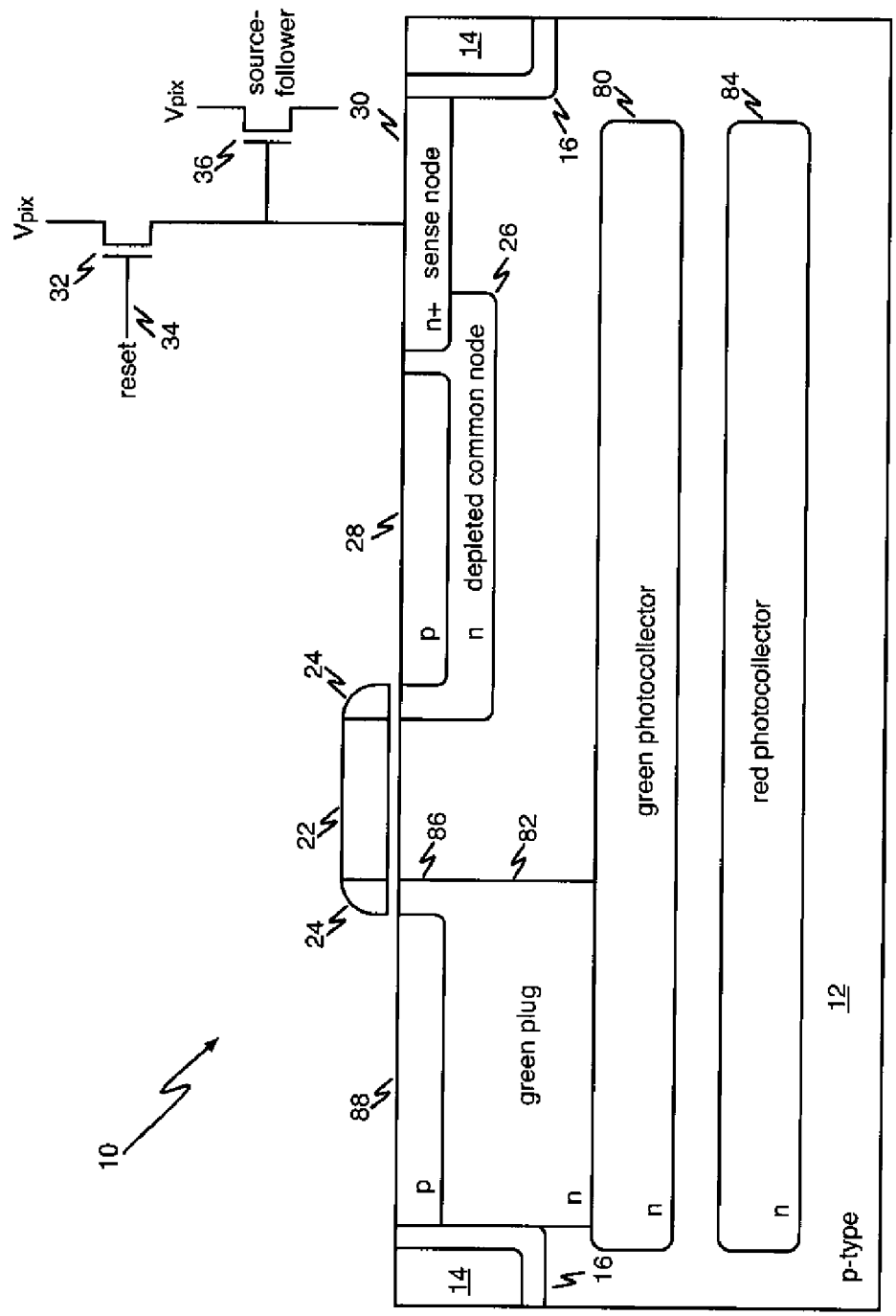
FIG. 2B is a cross-sectional view of a portion of the layout of FIG. 2A.

Referring to FIG. 2B, a cross section is shown that illustrates one of the buried color channels of the multicolor active CMOS pixel sensor shown in FIG. 2A. To the extent that elements shown in FIG. 1 are also shown in FIG. 2B, these elements will be identified in FIG. 2B using the same reference numerals used in FIG. 1 to identify like structures. The cross section of FIG. 2B shows the green collector 80 and green contact plug 82, and shows the relative position of the red collector 84, but for simplicity the red plug, red selection transistor and the associated connection to the common node are not shown. The green photocollector 80 and its associated deep contact plug 82 may be depleted. Similarly, the red photocollector and its associated deep contact plug may also be depleted. In the case of depleted green and red photocollectors and plugs, the n-type regions forming the deep contact plugs are more lightly doped than the n-type regions that form the sources of the red and green select transistors, and the green and red photocollectors are more lightly doped than the deep contact plugs in order to facilitate depletion and charge transfer from the photocollectors. The n-type transistor source region 86 shown in FIG. 2B is shown disposed under an associated optional pinning layer 88, and persons of ordinary skill in the art will readily understand that a similar structure can be used for the n-type transistor associated with the red photocollector and plug. The use of the pinning layer 88 can improve performance by reducing leakage current in the n-type source region 86 as is generally known in the art.

Referring now to FIGS. 3A through 3D, a series of energy diagrams illustrate the operation of a CMOS active pixel sensor according to the principles of the present invention. The energy diagrams of FIGS. 3A through 3D show the operation of one of the photocollectors. Persons of ordinary skill in the art will appreciate that the energy diagrams of FIGS. 3A through 3D show electron energy levels, so higher levels in the energy diagrams represent lower positive voltages. The cross-hatched areas in FIGS. 3A through 3D represent charge.

Figure 3A:
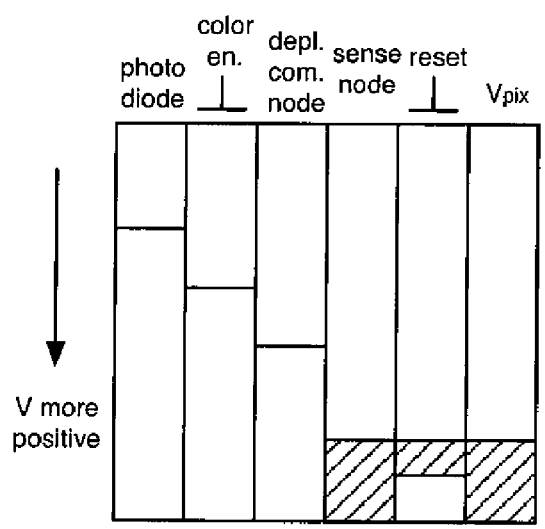
FIGS. 3A through 3D are energy diagrams illustrating the operation of a CMOS active pixel sensor according to the principles of the present invention.

Referring now to FIG. 3A, the pixel sensor is reset by applying a positive voltage to the gate of the reset transistor.

A lower positive voltage is applied to the color enable gate. As may be seen in FIG. 3A, the sense node is charged to the level of $V_{pix}$ through the reset transistor. The depleted common node depletes to a positive voltage level lower than $V_{pix}$ and the photodiode is depleted to a voltage level lower than that of the depleted common node. Persons of ordinary skill in the art will appreciate that because the common node is doped to a higher level than the photocollector, the reset operation will deplete it to a higher positive voltage than that of the depleted photodiode.

Figure 3B:
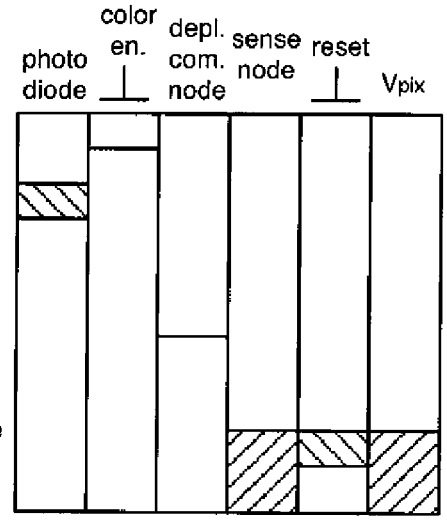

Next, as shown in FIG. 3B, the color select transistors is turned off as shown by the low voltage levels on its gate. It is during this period that photointegration takes place on all of the photocollectors. This is shown in the cross-hatched area in the photodiode energy bin of FIG. 3B as the voltage decreases from its reset level due to an accumulation of electrons on the photocollectors. The reset transistor is turned on during this period to provide an overflow path.

Figure 3C:
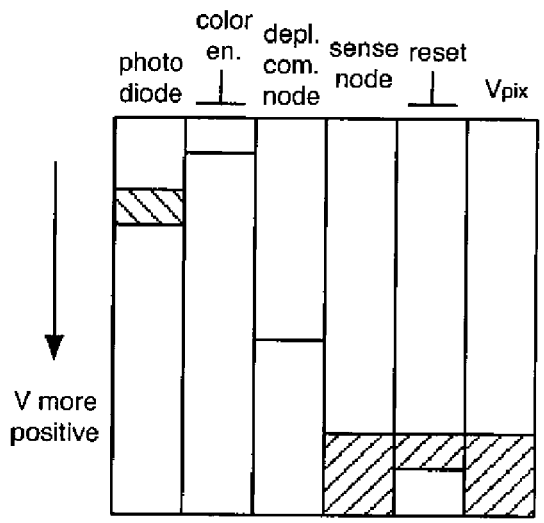

Next, as shown in FIG. 3C, the sense node is reset after the end of the photointegration period by again asserting a positive voltage on the gate of the reset transistor to turn it on while the color-select transistor remains turned off due to the low voltage at its gate. This step is performed to remove any noise that has resulted in charge accumulating on the sense node during the photointegration period. The reset transistor is then turned off.

Figure 3D:
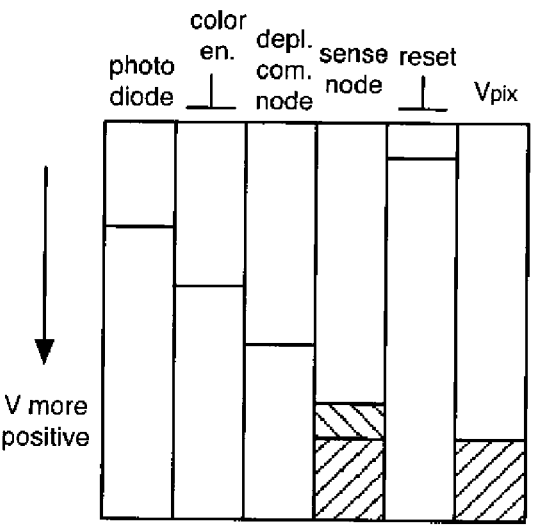

Next, as shown in FIG. 3D, the charge accumulated in the photodiode during integration is read out of the photocollector onto the sense node by turning on the color-select transistor while the reset transistor is turned off. As may be seen from the energy diagram, the charge from the photocollector is transferred to the sense node because the energy levels at each node in the path are successively lower, allowing the charge to flow from the photocollector to the sense node. The gate of the source-follower transistor is coupled to the sense node and the color signal in the form of the voltage present on the sense node is read out through the source-follower transistor. The sense node is reset as shown in FIG. 3C in between the reading of each color signal.

Figure 4:
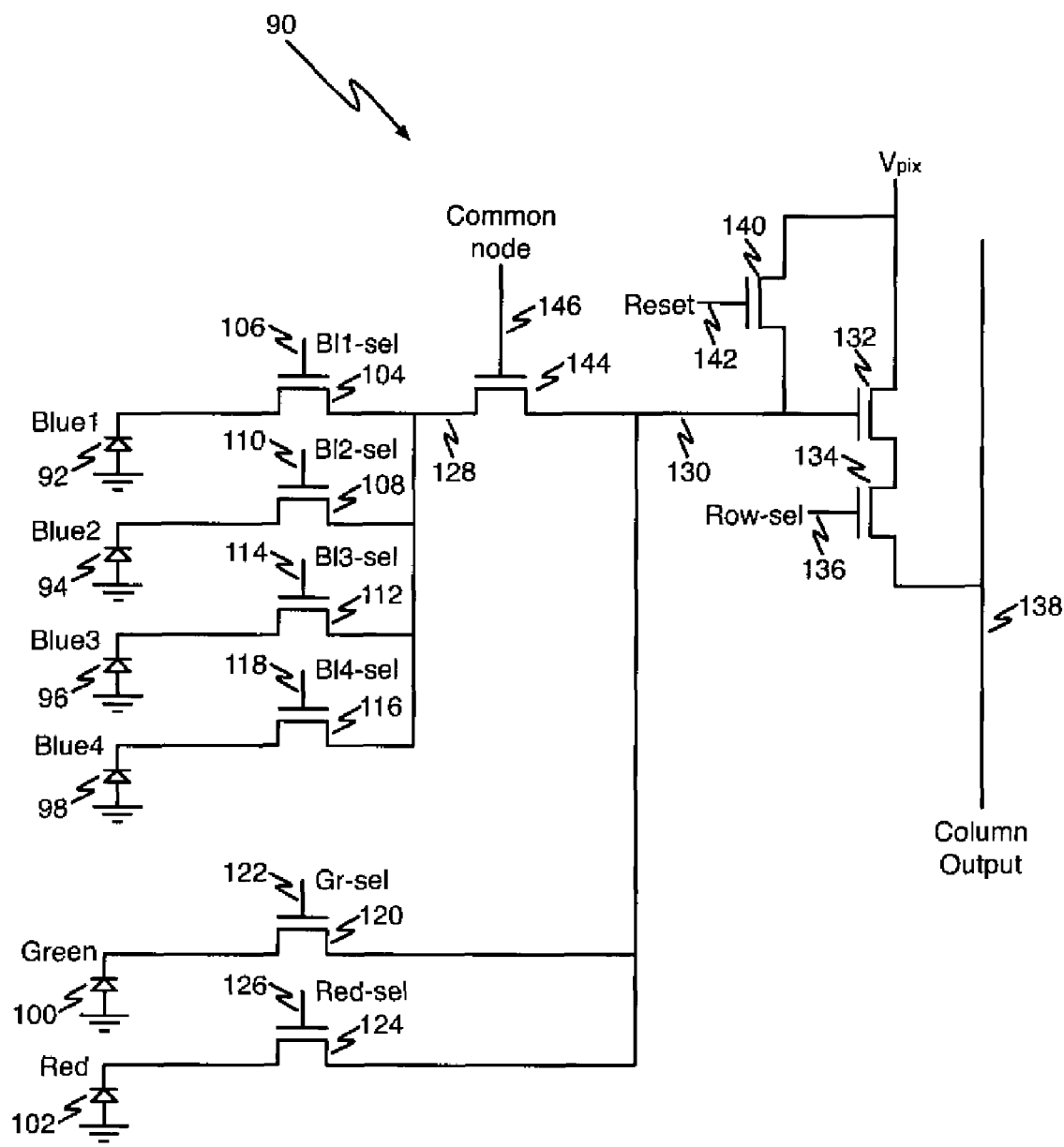
FIG. 4 is a schematic diagram of an alternative pixel according to the present invention wherein only the blue photocollectors are coupled to a depleted common node.

Referring now to FIG. 4, a schematic diagram shows an alternative pixel sensor 90 according to the present invention wherein only the depleted blue photocollectors are coupled to a depleted common node. In the illustrative embodiment shown in FIGS. 1 and 2A and 2B, all of the photocollectors are coupled to the depleted common node. In the illustrative embodiment shown in FIG. 4, the red and green collectors are coupled directly to the sense node. As in the case of the embodiment shown in FIGS. 1 and 2, the green and red collectors and their associated deep contacts may be depleted or non-depleted.

Pixel sensor 90 includes blue1 photodiode 92, blue2 photodiode 94, blue3 photodiode 96, blue4 photodiode 98, green photodiode 100, and red photodiode 102. The cathode of blue1 photodiode 92 is coupled to blue1 select transistor 104. The gate of blue1 select transistor 104 is coupled to blue1 select line 106. The cathode of blue2 photodiode 94 is coupled to blue2 select transistor 108. The gate of blue2 select transistor 108 is coupled to blue2 select line 110. The cathode of blue3 photodiode 96 is coupled to blue3 select transistor 112. The gate of blue3 select transistor 112 is coupled to blue3 select line 114. The cathode of blue4 photodiode 98 is coupled to blue4 select transistor 116. The gate of blue4 select transistor 116 is coupled to blue1 select line 118.

Similarly, the cathode of green photodiode 100 is coupled to green select transistor 120. The gate of green select transistor 120 is coupled to green select line 122. The cathode of red photodiode 102 is coupled to red select transistor 124. The gate of red select transistor 124 is coupled to red select line 126.

Blue1 select transistor 104, blue2 select transistor 108, blue3 select transistor 112, and blue4 select transistor 116 are coupled to depleted common node 128. Green select transistor 120 and red select transistor 124 are directly connected to sense node 130, to which the gate of source-follower amplifier transistor 132 is coupled. The drain of source-follower amplifier transistor 132 is coupled to the supply potential $V_{pix}$. The source of source-follower amplifier transistor 132 is coupled to the drain of row-select transistor 134. The gate of row-select transistor 134 is coupled to a row-select line 136 and its source is coupled to a column output line 138. Reset transistor 140 has its drain coupled to supply node $V_{pix}$, its source coupled to sense node 130, and its gate coupled to a reset line 142.

The pixel sensor 90 of FIG. 4 optionally includes an additional transistor 144 coupled between depleted common node 128 and sense node 130. The gate of transistor 144 is coupled to a common node gate line 146. Embodiments of the present invention according to FIG. 4 without transistor 144 are contemplated according to the present invention.

The pixel sensor 80 of FIG. 4 operates in the same manner as the pixel sensor of FIGS. 1 and 2, except that a signal is supplied to the gate of transistor 144 to bias it such that the potential in the channel of transistor 144 is higher than the common node potential but lower than the sense node potential, thereby allowing complete charge transfer from the common node to the sense node, and also forming a barrier that prevents the charge that collects on the sense node from the red and green color selects from flowing onto the common node. It is also possible to clock the barrier transistor 144 to increase signal capacity. In this mode the gate of transistor 144 is held at a higher voltage when the blue photocollector signals are transferred, and then biased to a lower voltage during readout of the red and green signals, thereby increasing the amount of charge that can be collected from the red and green photocollectors.

The advantage of using the barrier transistor 144 is that it separates the low capacitance depleted common node from the higher capacitance sense node while simultaneously allowing for the depleted common node to be self aligned between the blue collector transistors 104, 108, 112, 116 and the barrier transistor 144. The use of the self-aligned design can simplify the manufacture of the device, as is known in the art.

Figure 5:
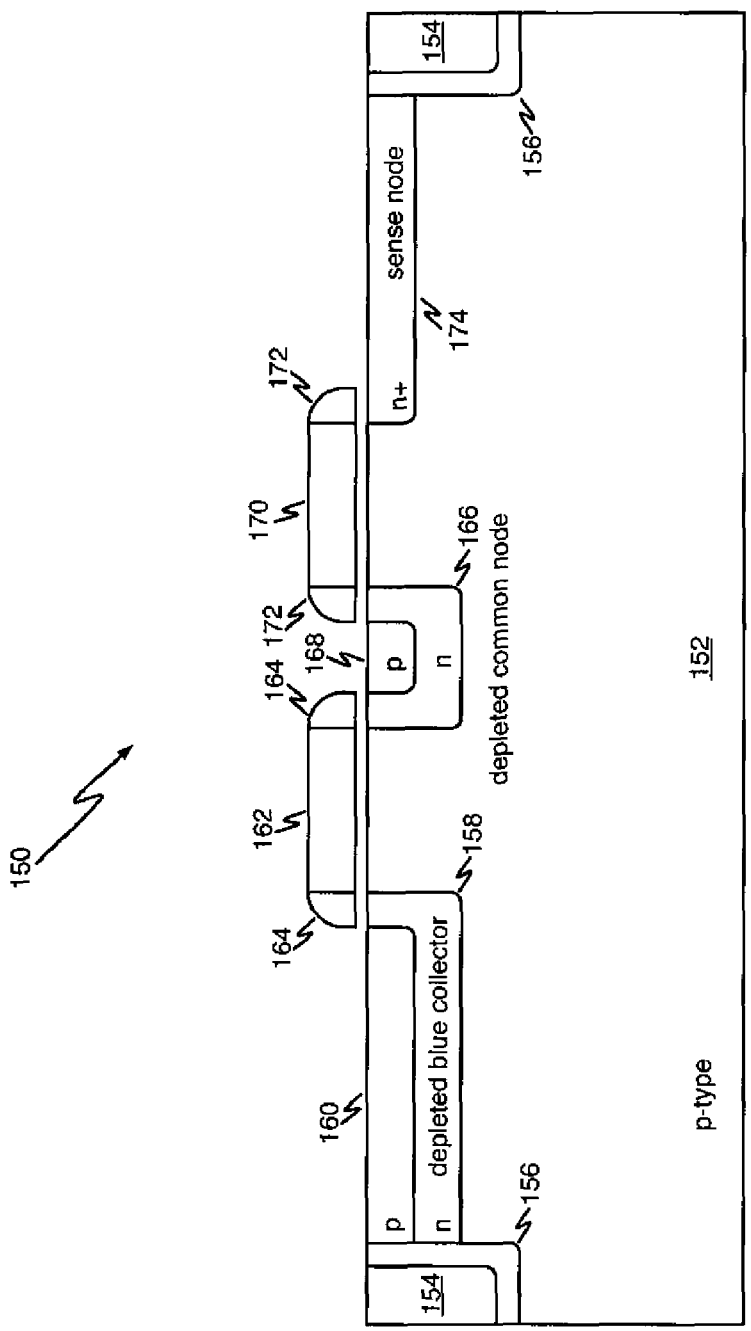
FIG. 5 is a cross-sectional diagram showing the depleted common node and sense node of the embodiment of FIG. 4 in more detail.

Referring now to FIG. 5, a cross-sectional diagram shows the depleted common node and sense node of the embodiment of FIG. 4 in more detail. FIG. 5 represents a cross-section of one of the depleted photocollectors of FIG. 4 and its associated connection to the depleted common node and sense node. As in the embodiment shown in FIGS. 1 and 2, the cross-sectional portion 150 of the active pixel sensor is formed in a p-type semiconductor body 152, which may be a well in a semiconductor substrate or may be the substrate itself. The pixel sensor is formed between field oxide regions 154 at the edges of which field-stop implants 156 have been made as is known in the art.

An illustrative n-type blue collector 158 is formed in the p-type region 152 and is covered by a p-type pinning region 160. N-type blue collector 158 is shown bounded at the left edge by field oxide region 154 and field-stop implant 156. A polysilicon gate 162 is aligned with the edge of n-type blue collector 158 and spacers 164 are used to place the edge of p-type pinning region 160 back from the edge of n-type blue collector 158.

A n-type depleted common node 166 has one edge aligned with the edge of polysilicon gate 162. A p-type pinning region 168 overlies n-type depleted common node 166 and is aligned with the spacer 164 shown at the right edge of polysilicon gate 162. A polysilicon gate 170 is aligned with the right edge of n-type depleted common node 166 and spacers 172 are used to place the edge of p-type pinning region 168 back from the edge of n-type depleted common node 166.

An n-type sense node 174 is formed in semiconductor body 152. The left edge of n-type sense node 174 extends under the spacer 172 shown at the right side of gate 170. Although not shown in FIG. 5, n-type sense node 174 is coupled to the source of an n-channel reset transistor and the gate of a source-follower amplifier transistor for the pixel sensor in the same manner as is the pixel sensor of FIGS. 1 and 2.

The distance between the top edges of the spacer 164 shown in FIG. 5 at the right side of gate 162 and the spacer 172 shown in FIG. 5 at the left side of gate 170 is chosen based on the need to engineer the pinchoff voltage of the depleted layer 166 such that the formation of potential pockets or potential barriers is avoided. In a typical embodiment using current CMOS processes, the top edges of the spacers may be spaced apart by about 0.20 to about 0.30 microns. As a result, the bottom edges of these spacers that mask the implant of p-type pinning region 168 are separated by a distance of about 0 to about 0.6 microns, although it is possible to engineer the process such that the spacing can be larger while still avoiding undesirable potential variations in the buried layer or adjacent areas.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A CMOS active pixel sensor including:
   a semiconductor body of a first conductivity type;
   at least one photocollector including a detector region of a second conductivity type opposite to that of the first conductivity type and having a first doping concentration, the at least one detector region disposed below a detector pinning region of the first conductivity type disposed on the surface of the semiconductor body, an edge of the at least one detector region extending beyond an edge of the detector pinning region;
   a common node formed from a region of the second conductivity type and having a second doping concentration at least equal in magnitude to the first doping concentration and disposed in the semiconductor body below a common-node pinning region of the first conductivity type disposed on the surface of the semiconductor body, a first edge of the region of the second conductivity type forming the common node extending beyond a first edge of the common-node pinning region and spaced apart from the detector region to form a select channel, and a second edge of the region of the second conductivity type extending beyond a second edge of the common-node pinning region opposite the first edge;
   a polysilicon color-select gate for each at least one photocollector, each color-select gate overlying and insulated from its select channel, the color-select gate coupled to a color-select signal line;
   a sense node formed by a reset-transistor source region of the second conductivity type disposed in the semiconductor body and having a third doping concentration at least equal in magnitude to the second doping concentration, the second edge of the region of the second conductivity type forming the common node underlying and in electrical contact with the reset-transistor source region;
   a reset-transistor drain region of the second conductivity type disposed in the semiconductor body and spaced apart from the reset-transistor source region to form a reset transistor channel, the reset-transistor drain region coupled to a power-supply node;
   a polysilicon reset-transistor gate overlying and insulated from the reset-transistor channel, the reset-transistor gate coupled to a reset-signal line; and
   a source-follower transistor having a gate coupled to the sense node, a drain coupled to a power-supply node, and a source forming a pixel-sensor output.

2. The CMOS active pixel sensor of claim 1 wherein the at least one photocollector is at least one blue photocollector.

3. The CMOS active pixel sensor of claim 2 wherein the at least one blue photocollector includes four blue photocollectors.

4. The CMOS active pixel sensor of claim 1 wherein the first conductivity type is p-type and the second conductivity type is n-type.

5. The CMOS active pixel sensor of claim 2 further including:
   a green photocollector including a detector region formed from a region of the second conductivity type and having the first doping concentration disposed in the semiconductor body at a depth greater than the at least one blue photocollector and electrically coupled to the surface of the semiconductor body through a first deep contact coupled to a green region of the second conductivity type disposed proximate to the surface of the semiconductor body and spaced apart from the common node to form a green-select channel;
   a polysilicon green color-select gate overlying and insulated from the green-select channel, the green color-select gate coupled to a green color-select signal line;
   a red photocollector including a detector region formed from a region of the second conductivity type and having the first doping concentration disposed in the semiconductor body at a depth greater than the green photocollector and electrically coupled to the surface of the semiconductor body through a second deep contact coupled to a red region of the second conductivity type disposed proximate to the surface of the semiconductor body and spaced apart from the common node to form a red-select channel; and
   a polysilicon red color-select gate overlying and insulated from the red-select channel, the red color-select gate coupled to a red color-select signal line.

6. The CMOS active pixel sensor of claim 5 wherein:
   the green region is disposed below a green pinning region of the first conductivity type disposed on the surface of the semiconductor body, an edge of the green region extending beyond an edge of the green pinning region to the green select channel; and
   the red region is disposed below a red pinning region of the first conductivity type disposed on the surface of the semiconductor body, an edge of the red region extending beyond an edge of the red pinning region to the red select channel.

7. The CMOS active pixel sensor of claim 1 wherein the third doping concentration is equal to the second doping concentration and is selected such that application of a reset voltage to the common node does not deplete the common node of majority carriers.

8. The CMOS active pixel sensor of claim 1 wherein the third doping concentration is greater than the second doping concentration and is selected such that application of a reset voltage to the common node depletes the common node of majority carriers and does not deplete the sense node of majority carriers.

9. The CMOS active pixel sensor of claim 1 wherein the first doping concentration is equal to the second doping concentration.

10. The CMOS active pixel sensor of claim 1 wherein the second doping concentration is greater than the second doping concentration.

* * * * *